(12) United States Patent
Akahori

(10) Patent No.: US 6,767,829 B2
(45) Date of Patent: Jul. 27, 2004

(54) PLASMA DEPOSITION METHOD AND SYSTEM

(75) Inventor: Takashi Akahori, Shiroyama-Machi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/221,860

(22) PCT Filed: Mar. 16, 2001

(86) PCT No.: PCT/JP01/02135
§ 371 (c)(1),
(2), (4) Date: Sep. 17, 2002

(87) PCT Pub. No.: WO01/69642
PCT Pub. Date: Sep. 20, 2001

(65) Prior Publication Data
US 2003/0129851 A1 Jul. 10, 2003

(30) Foreign Application Priority Data
Mar. 17, 2002 (JP) .......................................... 2000-77049

(51) Int. Cl.⁷ ............................................. H01L 21/44
(52) U.S. Cl. ....................... 438/680; 427/569; 156/345
(58) Field of Search .................. 156/345; 118/723–729; 427/569; 219/121; 257/635–648, 513, 624; 438/680, 681

(56) References Cited

U.S. PATENT DOCUMENTS

| | | | |
|---|---|---|---|
| 5,804,259 A | | 9/1998 | Robles |
| 5,846,885 A | | 12/1998 | Kamata et al. |
| 5,989,998 A | * | 11/1999 | Sugahara et al. ........... 438/623 |
| 6,001,728 A | * | 12/1999 | Bhan et al. .................. 438/624 |
| 6,070,550 A | * | 6/2000 | Ravi et al. ................... 118/723 |
| 6,072,227 A | * | 6/2000 | Yau et al. .................... 257/642 |
| 6,162,709 A | * | 12/2000 | Raoux et al. ............... 438/513 |
| 6,508,199 B1 | * | 1/2003 | Oyabu ........................ 118/723 |
| 6,514,880 B2 | * | 2/2003 | Matsuki et al. ............. 438/780 |
| 6,534,616 B2 | * | 3/2003 | Lee et al. ..................... 528/42 |

FOREIGN PATENT DOCUMENTS

| | | |
|---|---|---|
| JP | 03-204925 | 9/1991 |
| JP | 10340900 | 12/1998 |
| WO | 99/21706 | 5/1999 |

* cited by examiner

Primary Examiner—Matthew Smith
Assistant Examiner—Calvin Lee
(74) Attorney, Agent, or Firm—Crowell & Moring LLP

(57) ABSTRACT

There is provided a deposition technique wherein the amounts of eliminated F and H are small in the deposition of an insulating film, such as an SiOF film or an SiCHO film, which contains silicon, oxygen and other components and which has a lower dielectric constant than the dielectric constant of a silicon oxide film.

A plasma processing system for producing plasma with the energy of a power applied between first and second electrodes which are provided in a vacuum vessel so as to face each other in parallel and which are connected to separate high-frequency power supplies, respectively, is used. An object to be processed, e.g., a semiconductor wafer is mounted on the first electrode. The frequency of the high-frequency power applied to the first electrode is set to be in the range of from 2 MHz to 9 MHz, and the frequency of the high-frequency power applied to the second electrode is set to be 50 MHz or higher, to deposit an insulating film on the wafer.

6 Claims, 7 Drawing Sheets

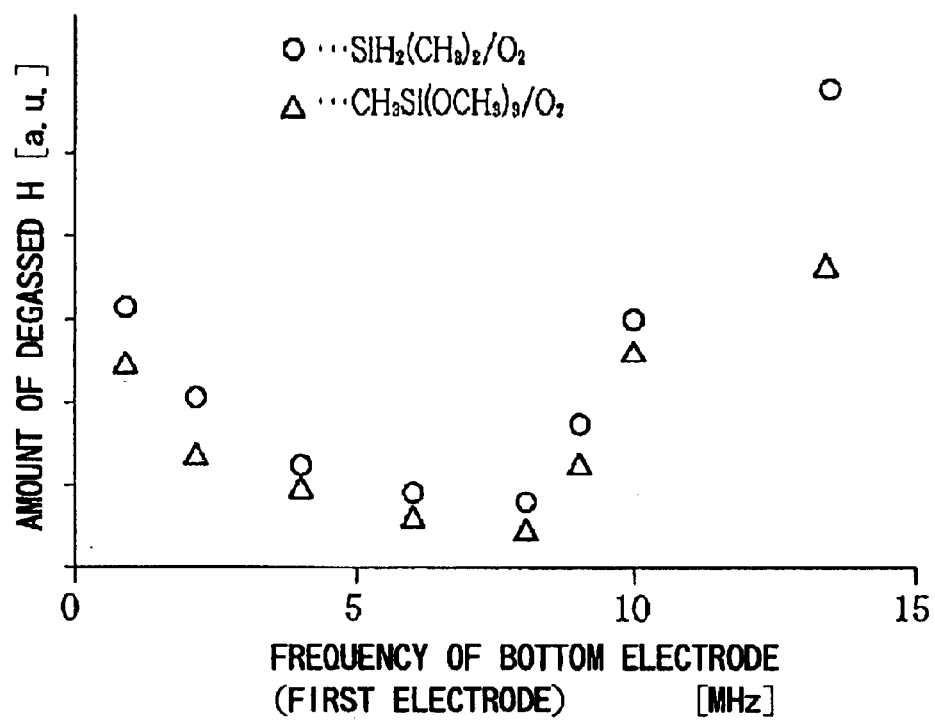
F I G. 8
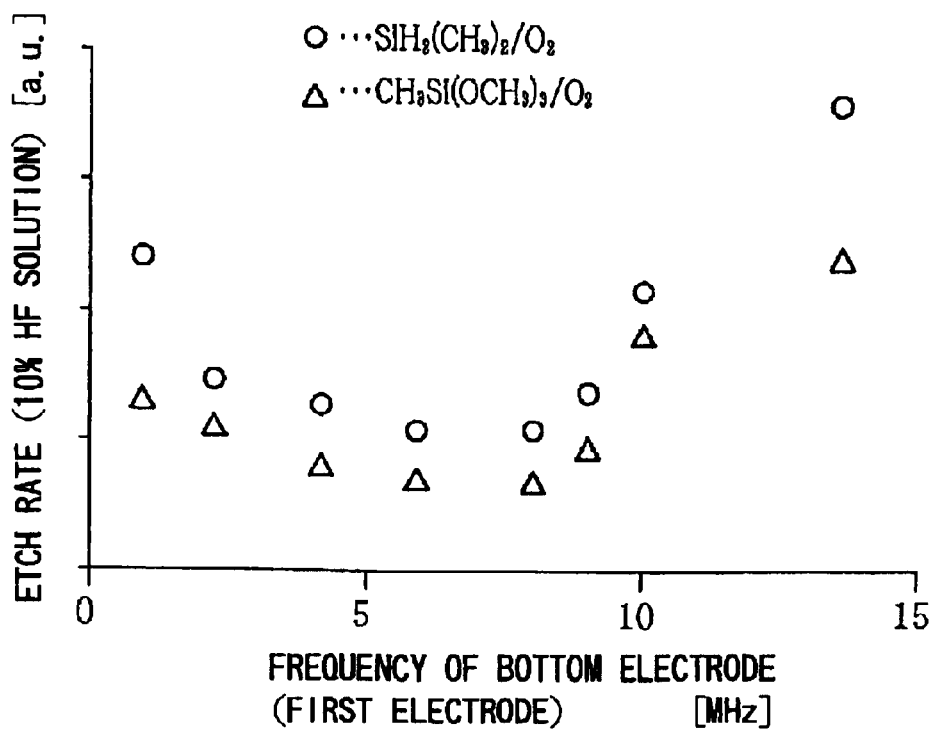
F I G. 9

PLASMA DEPOSITION METHOD AND SYSTEM

BACKGROUND OF THE INVENTION

1. Field of the Invention

The present invention relates generally to a method and system for depositing an insulating film having a low dielectric constant of a silicon oxide film to which a predetermined material is added.

2. Description of the Prior Art

As a conventional interlayer dielectric film of a device, a silicon oxide film ($SiO_2$ film) has been used. As one of techniques for depositing an $SiO_2$ film, there is a method using a parallel plate plasma processing system for applying a high-frequency power between top-and bottom electrodes, which are parallel to each other, to produce plasma to deposit a thin film with the plasma. As the prior art using this system, there is, e.g., Japanese Patent No. 2,774,367. This patent disclose that the frequency of a high-frequency power supply connected to the top electrode is set to be 100 MHz or higher, and the frequency of a high-frequency power supply connected to the bottom electrode is set to be in the range of from 10 MHz to 50 MHz, to apply a high frequency power between both electrodes to produce the plasma of a silane containing gas and oxygen gas to deposit an $SiO_2$ film.

In recent years, in order to further accelerate the operation of devices, it is required that the dielectric constant (relative dielectric constant) of an interlayer dielectric film is lowered. The dielectric constant (relative dielectric constant) of an $SiO_2$ film having been conventionally used is about 0.4 which can not cope with such a request, so that it is desired that an insulating film having a low dielectric constant is provided. Therefore, the inventor has studied insulating films which contain an $SiO_2$ film as an principal component and other components and which has a lower dielectric constant than the $SiO_2$ film, e.g., SiOF films containing fluorine (F) and SiCHO films containing carbon (C) and hydrogen (H).

However, if an insulating film of this type is deposited by the above described prior art method, there is a problem in that a large amount of the other components are eliminated from the film during a heat treatment which will be carried out later with respect to a semiconductor wafer. For example, if F is eliminated from the SiOF film, a metal wiring is corroded, and if H (hydrogen) is eliminated from the SiCHO film, H is accumulated between the SiCHO film and the metal wiring, so that the metal wiring is peeled off. It is guessed that the reason for this is that the energy of ions is too small to decrease the number of dangling bonds (unbonded hands), so that the other components (mixed components), such as F mixed in the $SiO_2$ film, are easily eliminated.

SUMMARY OF THE INVENTION

It is therefore an object of the present invention to eliminate the aforementioned problems and to provide a plasma deposition method and system capable of depositing a high quality insulating film having a low dielectric constant.

In order to accomplish the aforementioned and other objects, according to one aspect of the present invention, a method and system for depositing a silicon oxide film is provided, which contains a predetermined material having a lower dielectric constant than the dielectric constant of a silicon oxide film ($SiO_2$ film), on an object to be processed, using a so-called parallel plate plasma processing system, wherein the frequency of a high-frequency power applied to a first electrode, on which the object to be mounted, is set to be in the range of from 2 MHz to 9 MHz, and the frequency of a high-frequency power applied to a second electrode is set to be 50 MHz or higher. As the silicon oxide film containing the predetermined material, there are F containing films (SiOF films), C and H containing films (SiCHO films), and C, H and N containing films (SiCHNO films). According to the present invention, since the energy of ions during processing has a moderate magnitude, the eliminated amount of the predetermined material is small, and the network bonds are sufficiently formed in the film, so that it is possible to obtain a high quality insulating film.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 8 is a characteristic diagram showing the relationship between the frequency of a high-frequency power applied to the bottom electrode and the amount of H eliminated from an SiCHO film;

FIG. 9 is a characteristic diagram showing the relationship between the frequency of a high-frequency power applied to the bottom electrode and the etch rate of the SiCHO film;

DESCRIPTION OF THE PREFERRED EMBODIMENTS

Figure 1:
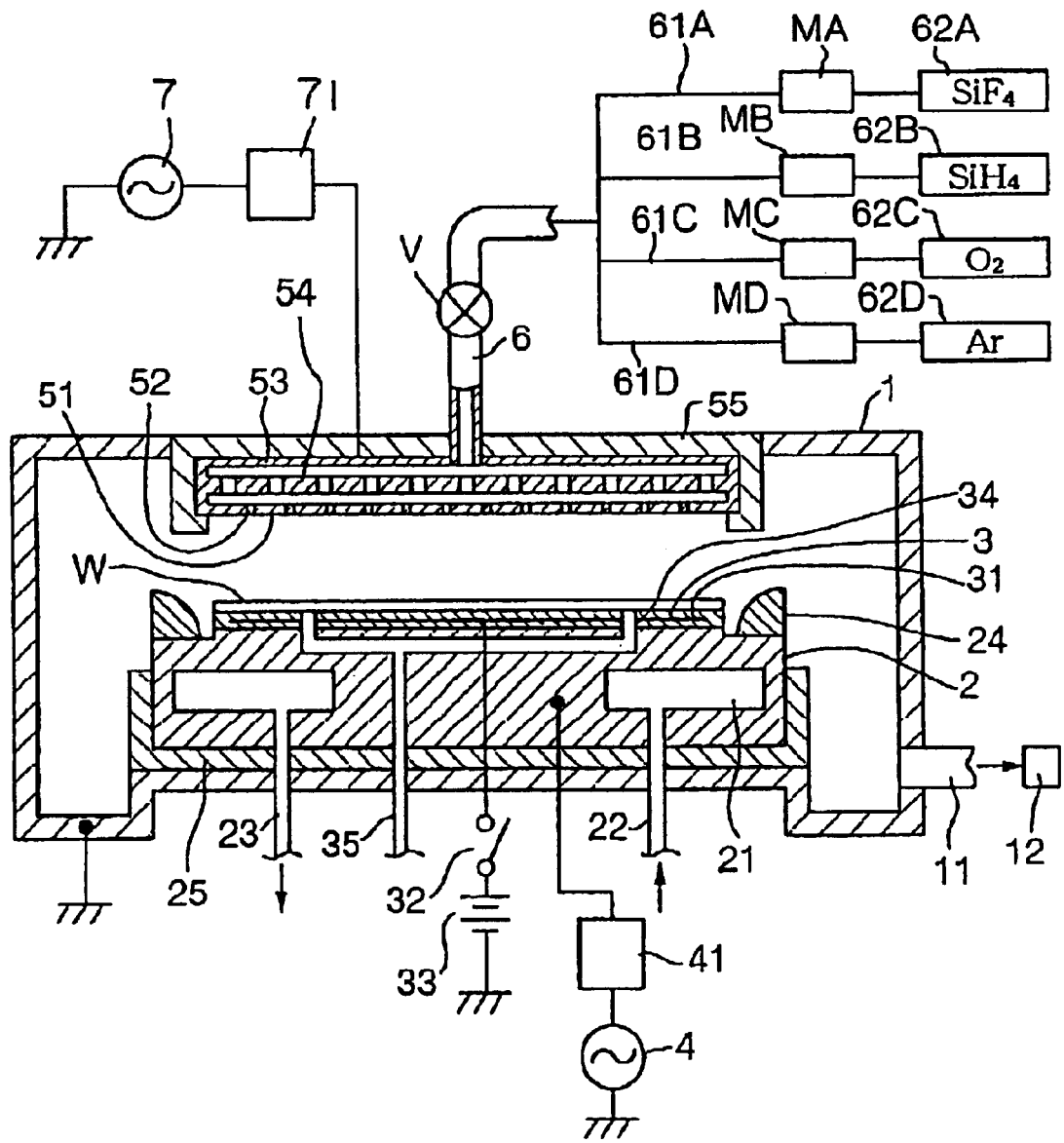
FIG. 1 is a sectional view showing the whole construction of a preferred embodiment of a plasma processing system according to the present invention.

Referring now to the accompanying drawings, particularly to FIG. 1, a preferred embodiment of a plasma deposition system according to the present invention will be described below.

This plasma deposition system has a grounded cylindrical vacuum vessel 1 made of, e.g., aluminum. On the bottom of the vacuum vessel 1, a susceptor 2 is provided for supporting thereon an object to be processed, e.g., a semiconductor wafer, (which will be hereinafter referred to as a wafer). The susceptor 2 also serves as a bottom electrode which is a first electrode of parallel plate electrodes. The susceptor 2 is made of, e.g., aluminum, and has a substantially cylindrical shape. On the surface of the susceptor 2, an electrostatic chuck 3 is provided. The electrostatic chuck 3 comprises a chuck electrode 31 embedded in a thin dielectric layer. When a dc voltage is applied to the chuck electrode 31 from a dc voltage source 33 via a switch 32, the chuck electrode 31 electrostatically absorbs a wafer W. The electrostatic chuck 3 has a plurality of a heat-transferring holes 34 through which a heat-transferring gas, e.g., helium gas, is supplied from a heat-transferring gas supply pipe 35 to a fine gap between the wafer and the electrostatic chuck 3. A lifter pin (not shown) capable of passing through the electrostatic chuck 3 and the susceptor 2 to move vertically is provided for delivering the wafer W.

In the susceptor 2, a refrigerant passage 21 is formed so that a refrigerant supplied from a refrigerant supply pipe 22 passes through the refrigerant passage 21 to be discharged from a refrigerant discharge pipe 23. The temperature of the wafer W is controlled by, e.g., the temperature of the refrigerant and the efficiency of heat transfer between the wafer W and the electrostatic chuck 3 due to the heat-transferring gas. On the peripheral edge portion of the top of the susceptor 2, a ring body 24 of an insulating material is provided for effectively causing reactive ions to enter the wafer W.

The susceptor 2 is inserted into an opening, which is formed in the top face of a flat cylindrical insulator body 25, so as to be isolated from the vacuum vessel 1. A matching device 41 and a first high-frequency power supply 4 are provided between the susceptor 2, which is the bottom electrode (first electrode), and a reference potential, e.g., the earth. The frequency of the first high-frequency power supply 4 is set to be a predetermined frequency of, e.g., 2 MHz to 9 MHz.

On the ceiling portion of the vacuum vessel 1, an electrode plate 51 forming the top electrode serving as the second electrode is provided so as to face the susceptor 2 in parallel. The electrode plate 51 is formed of, e.g., aluminum coated with $SiO_2$, and has a large number of gas supply holes 52. The electrode plate 51 is supported on an electrode supporting body 53 of a conductive material. Between the electrode plate 51 and the electrode supporting body 53, a gas diffusing plate 54 is arranged, and a gas supply pipe 6 is connected to the electrode supporting body 53 for supplying a process gas to a space between the electrode supporting body 53 and the gas diffusing plate 54, so that the process gas from the gas supply pipe 6 is supplied to a process space from the gas supply holes 52 of the electrode plate 51 via the gas diffusing plate 54. The electrode plate 51 and the electrode supporting body 53 are isolated from the vacuum vessel 1 by means of an insulator 55.

Between the electrode plate 51 serving as the top electrode (second electrode) and the reference potential, e.g., the earth, a matching device 71 and a second high-frequency power supply 7 are provided. The frequency of the second high-frequency power supply 7 is set to be, e.g., 50 MHz or higher, e.g., 60 MHz.

The gas supply pipe 6 is divided into a plurality of branching passages, each of which is connected to a process gas source. In this preferred embodiment, in order to deposit an SiOF film, four branching passages 61A through 61D are connected to gas supply sources 62A through 62D for supplying silicon tetrafluoride ($SiF_4$) gas, monosilane ($SiH_4$) gas, oxygen ($O_2$) gas and argon (Ar) gas, respectively. Furthermore, MA through MD denote flow control parts (mass flow controllers), and V denotes a valve.

As the exhaust system of the vacuum vessel 1, an exhaust pipe 11 is connected to the bottom of the vacuum vessel 1 to evacuate the interior of the vacuum vessel 1 by means of a vacuum pump 12.

The operation of the above described preferred embodiment will be described below.

The wafer W serving as an object to be processed is introduced from a load-lock chamber (not shown), which is adjacent to the vacuum vessel 1, into the vacuum vessel 1 which has been held at a predetermined degree of vacuum. Then, the wafer W is mounted on the susceptor 2, which has been adjusted at a predetermined temperature, by the vertical movement of the lifter pin (not shown). Then, the switch 32 is turned on to apply a dc voltage to the chuck electrode 31, so that the wafer W is fixed by the electrostatic chuck 3. Subsequently, the valve V is open to first supply the flow rate of a gas which does not contribute to a deposition reaction by itself, e.g., $O_2$ gas, to the vacuum vessel 1 from the gas supply source 62C via the gas supply pipe 6 and the gas supply holes 52 while the flow control part MC controls the flow rate of the gas.

Then, the second high-frequency power supply applies a high-frequency power having a power value of 2.7 kW and a predetermined frequency of 50 MHz or higher, e.g., 60 MHz, between the second electrode (electrode plate) 51 and the earth. Thereafter, e.g., after 1 to 2 minutes, $SiF_4$ gas, $SiH_4$ gas and Ar gas are supplied to the vacuum vessel 1 from the gas supply holes 52 via the gas supply pipe 6 while the flow rates of these gases are controlled by the flow control parts MA, MB and MD, respectively, and the first high-frequency power supply 4 applies a high-frequency power having a power value of, e.g., 0.3 kW, and a frequency of 2 MHz to 9 MHz, e.g., 8 MHz, between the first electrode (susceptor) 2 and the earth.

As a result, the high-frequency power is applied between the first electrode 2 and the second electrode 51, and its energy produces the plasma of the above described gases to deposit an SiOF film on the wafer W. The SiOF film is a film wherein F enters $SiO_2$ serving as a principal component, and which has a dielectric constant of 3.5 which is smaller than the dielectric constant of an $SiO_2$ film. Furthermore, when $O_2$ gas is introduced, other gases, such as Ar and $N_2$ gases, together with $O_2$ gas, may be introduced, but it is required that no film is deposited with these gases.

As described above, the reason why the high-frequency power is applied to the first electrode 2 after the high-frequency power is applied to the second electrode 51 is as follows. If the high-frequency power is first applied to the first electrode 2, ions enter the wafer W to be sputtered. Therefore, the high-frequency power is first applied to the second electrode 51, and after the time required for plasma to be stable and for the temperature of the wafer W to rise to a predetermined temperature, the high-frequency power is applied to the first electrode 2.

As an example of process conditions, the flow rates of $SiF_4$ gas, $SiH_4$ gas, $O_2$ gas and Ar gas are set to be 28 sccm, 22 sccm, 250 sccm and 50 sccm, respectively, and the pressure in the vacuum vessel 1 is set to be 1.3 Pa (10 mTorr).

In this preferred embodiment, the frequency of the high-frequency power applied to the bottom electrode (susceptor 2) serving as the first electrode, on which the wafer W is supported, is in the range of from 2 MHz to 9 MHz, so that the energy of ions during deposition has a moderate magnitude which is not too large and not too small as will be described later. Therefore, the amount of F eliminated from the SiOF film during the subsequent heat process is suppressed, if the SiOF film is applied to the interlayer dielectric film, the corrosion of the metal wiring is suppressed. In addition, since the frequency of the high-frequency power applied to the top electrode (electrode plate 51) serving as the second electrode is set to be 50 MHz or higher, the top electrode 51 can be inhibited from being sputtered as will be described later, so that it is possible to decrease the contamination of the SiOF film by the sputtering component of the top electrode 51.

In addition, $SiO_2$ may be used as a principal component, and C and H may be mixed therein as other components. In this case, an SiCHO film is obtained. In order to deposit a film of this type, an alkylsilane gas $[Si(C_nH_{2n+1})_mH_{4-m}]$ and oxygen gas serving as raw material gases may be reacted with each other. The alkylsilane gases include methylsilane gases, such as monomethylsilane gas $[SiH_3CH_3]$, dimethylsilane gas $[SiH_2(CH_3)_2]$, trimethylsilane gas $[SiH(CH_3)_3]$ and tetrasilane gas $[Si(CH_3)_4]$, and ethylsilane gas. In place of alkylsilane gases, alkoxysilane gas, such as $CH_3Si(OCH_3)_3$, may be used, or these gases may be mixed to be used.

The other components may be C, H and N. In this case, an SiCHNO film is obtained. In order to deposit a film of this type, an alkylsilane gas such as methylsilane gas, alkoxysilane gas, oxygen gas and nitrogen gas ($N_2$ gas) may be reacted with each other. In the place of $N_2$ gas, nitrogen oxide gas, dinitrogen oxide gas, nitrogen tetra oxide gas or ammonia gas may be used, or these gases may be mixed to be used. The dielectric constant of the film thus obtained by adding N to the SiCHO film is slightly increased by the addition of N. However, this film is suitable for, e.g., an interlayer dielectric film of a device using a Cu wiring, since it has the diffusion inhibiting effect on Cu and the anti-hygroscopic property enhancing effect (the water confining effect).

EXAMPLES

Example 1

On the process conditions in the above described preferred embodiment, the frequency f1 of the high-frequency power applied to the bottom electrode 2 was set to be 1 MHz, 2 MHz, 4 MHz, 6 MHz, 8 MHz, 9 MHz, 10 MHz and 13.56 MHz to deposit thin films. With respect to the thin films thus obtained, the amount of eliminated F (the amount of degassing) was examined, so that the results shown in FIG. 2 were obtained. The amount of eliminated F was examined by the TDS spectrum (Thermal Desorption Spectroscopy). Each of the SiOF films was etched with 10 wt. % HF solution (hydrofluoric acid solution) to examine etch rates, so that the results shown in FIG. 3 were obtained. The units of the eliminated amounts and etch rates of the SiOF films are arbitrary.

Figure 2:
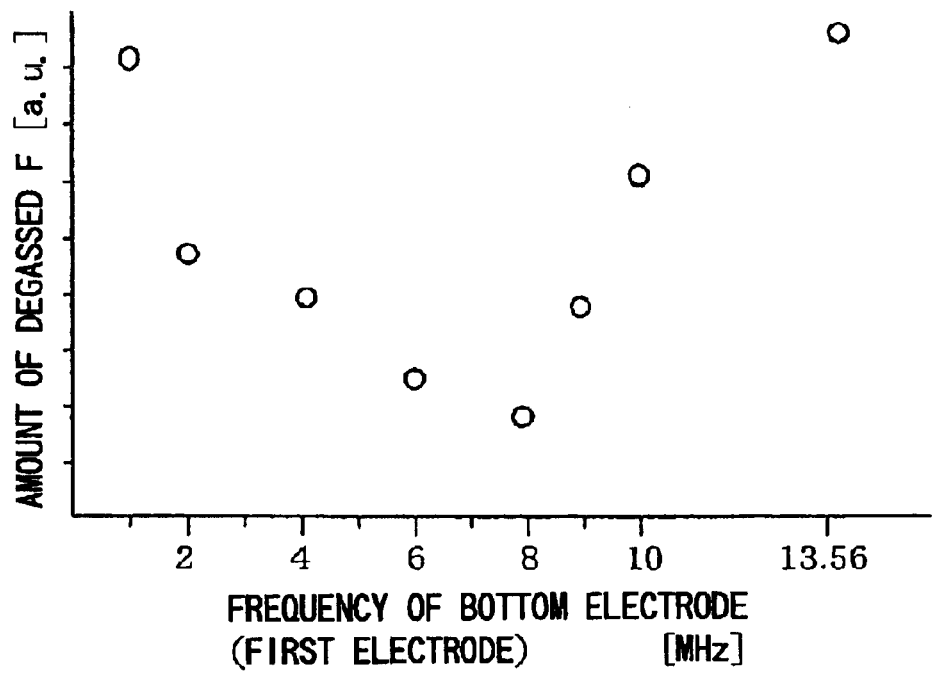
FIG. 2 is a characteristic diagram showing the relationship between the frequency of a high-frequency power applied to a bottom electrode (a first electrode) and the amount of F eliminated from an SiOF film.
Figure 3:
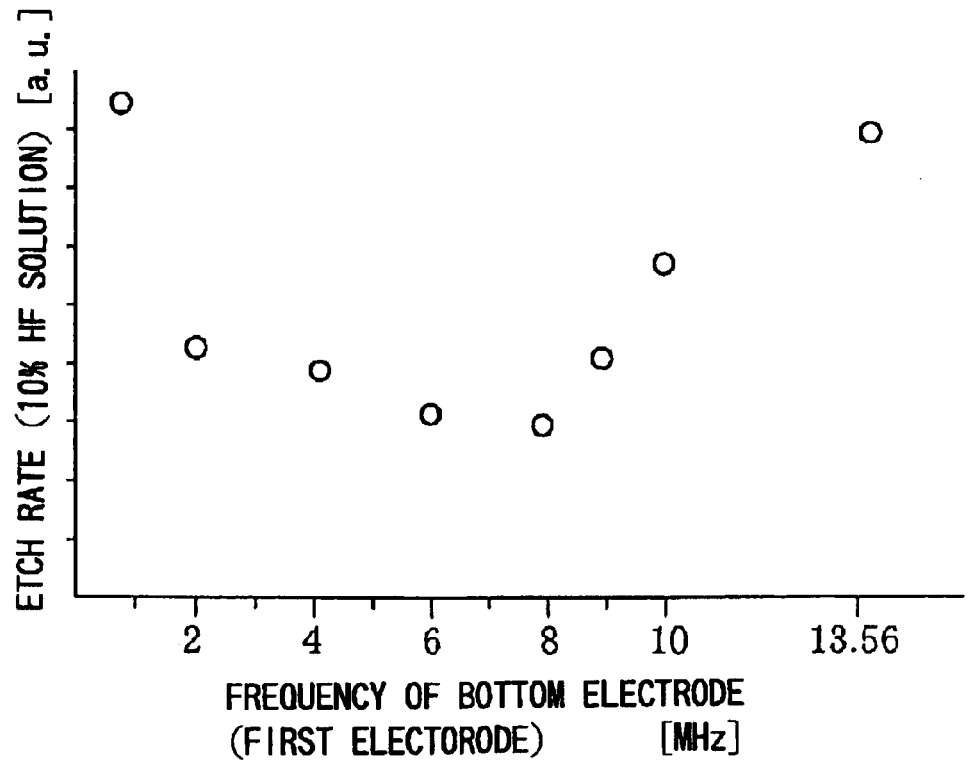
FIG. 3 is a characteristic diagram showing the relationship between the frequency of a high-frequency power applied to the bottom electrode and the etch rate of the SiOF film.

From the results shown in FIGS. 2 and 3, it can be seen that when the frequency f1 is in the range of from 2 MHz to 9 MHz, the amount of eliminated F is small, and the etch rate is slow, so that a compact and high quality SiOF film having strong bonds can be obtained. It is considered that the reason for this is that if the frequency f1 is lower than 2 MHz, the energy of ions in plasma is too great, so that the network bonds of the respective atoms, particularly Si—F or O—F bond, are cut so that F exists in the film in an unstable state. It is considered that the phenomenon that bonds in the film are cut is caused mainly by the influence of the collision energy of argon ions. On the other hand, it is considered that if the frequency f1 exceeds, the energy of ions in plasma is too small, so that F exists in the film in an unstable state without being sufficiently bonded. Therefore, if the frequency f1 is beyond the range of from 2 MHz to 9 MHz, it is guessed that the film is porous, F is easily eliminated, and the etch rate increases.

Figure 4:
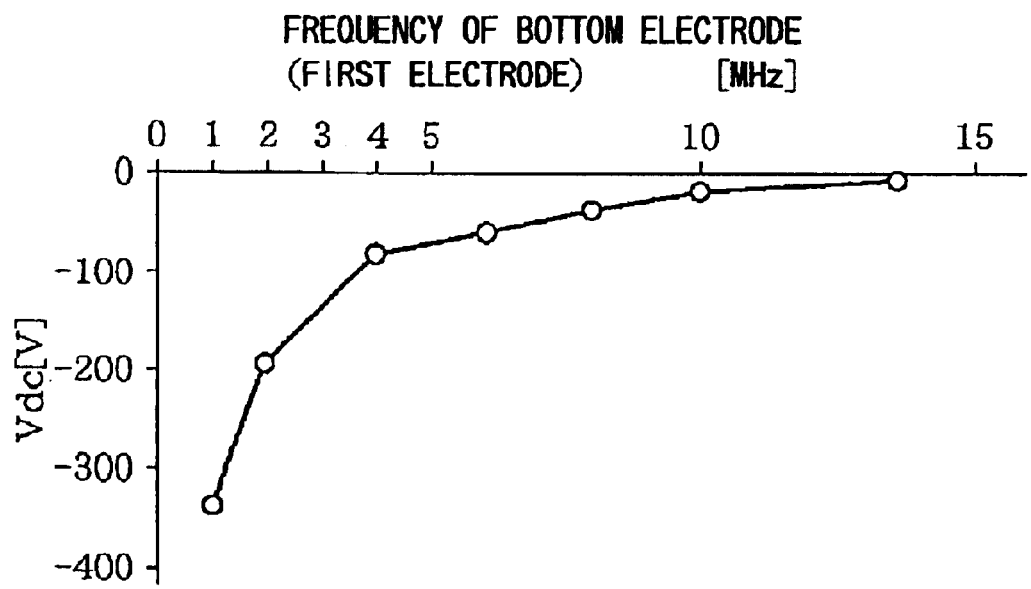
FIG. 4 is a characteristic diagram showing the relationship between the frequency of a high-frequency power applied to the bottom electrode and the self-bias of the bottom electrode.
Figure 5:
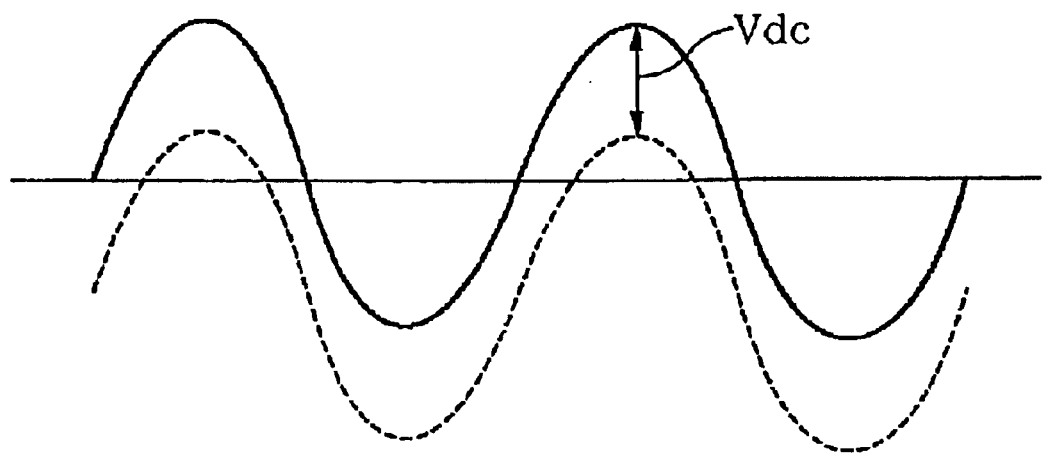
FIG. 5 is an illustration for explaining the self-bias.

When the thin films were deposited at the respective frequencies f1 as described above, the value of the self-bias of the bottom electrode 2 was examined, so that the results shown in FIG. 4 were obtained. This self-bias is obtained by providing an oscilloscope between the bottom electrode 2 and the earth and by obtaining a differential voltage Vdc between the voltage waveform (solid line) of the first high-frequency power supply 4 and the voltage waveform (dotted line) appearing at the oscilloscope as shown in FIG. 5. As can be seen from FIG. 4, Vdc increases as the frequency decreases, and it is very high if the frequency is lower than 2 MHz, so that it is supported that the collision energy of ions is too great. In view of the foregoing, the frequency f1 of the high-frequency power applied to the bottom electrode 2 must be in the range of from 2 MHz to 9 MHz.

Figure 6:
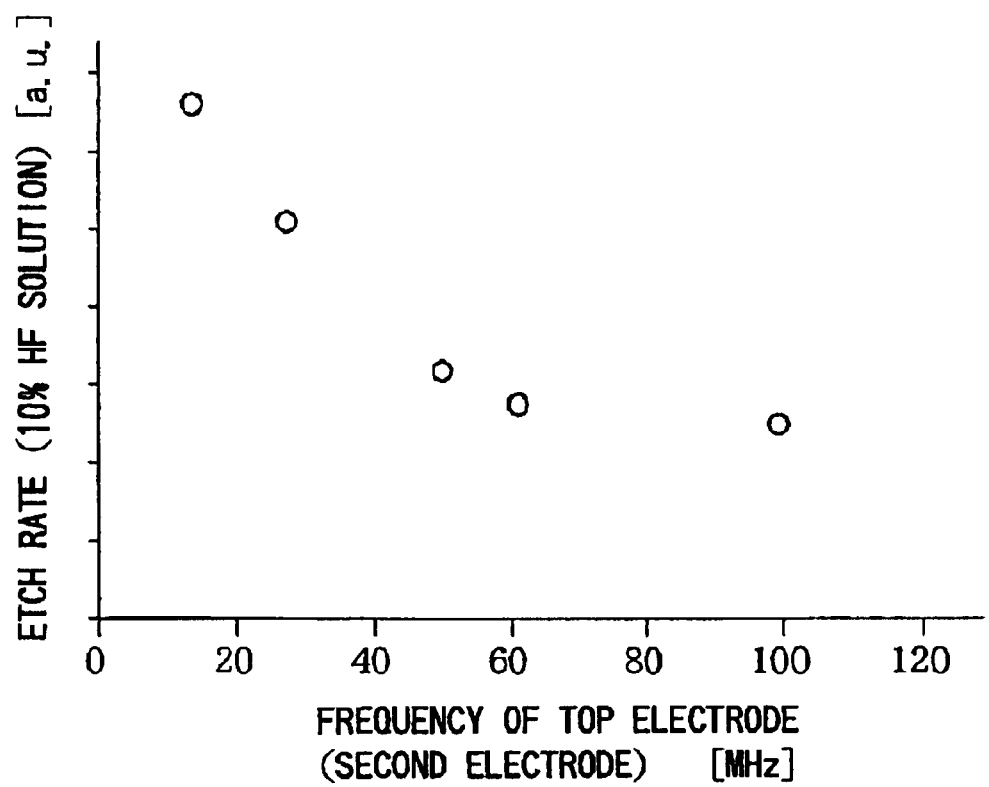
FIG. 6 is a characteristic diagram showing the relationship between the frequency of a high-frequency power applied to a top electrode (a second electrode) and the etch rate of the SiOF film.
Figure 7:
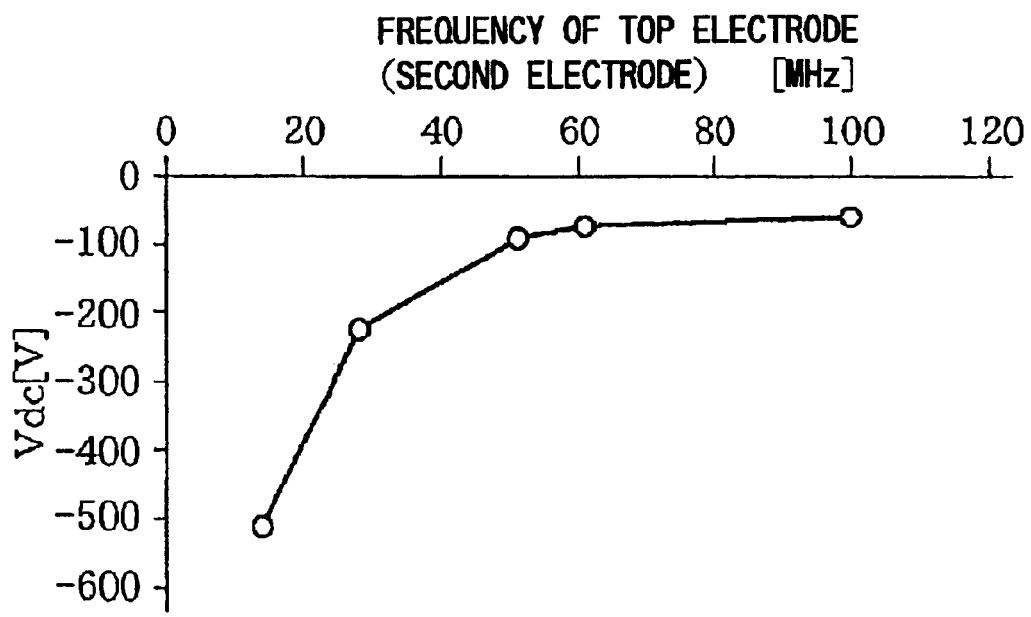
FIG. 7 is a characteristic diagram showing the relationship between the frequency of a high-frequency power applied to the top electrode and the self-bias of the top electrode.

On the process conditions in the above described preferred embodiment, the high-frequency power was not applied to the bottom electrode 2, i.e., the power of the first high-frequency power supply 4 was set to be zero, and the frequency f2 of the top electrode 51 was set to be 13.56 MHz, 27 MHz, 50 MHz, 60 MHz and 100 MHz to similarly examine the etch rate and the magnitude of self-bias (Vdc) of each of SiCF films every frequency, so that the results shown in FIGS. 6 and 7 were obtained. If the frequency f2 is lower than 50 MHz, the etch rate is high as can be seen from FIG. 6, and Vdc is high as can be seen from FIG. 7. It is considered that this means that if the frequency f2 is lower than 50 MHz, the energy of ions increases to sputter the top electrode 51, so that its sputtered substance is incorporated into the SiOF film to serve as contamination. That is, it is considered that the sputtered substance, which is an impurity flying from the top electrode 51, is incorporated into the SiOF film to serve as contamination. That is, if the sputtered substance, which is the impurity flying from the top electrode 51, is incorporated into the SiOF film, the impurity exists in a non-network bond state, so that the film is porous and brittle. Therefore, it is required that the frequency f2 of the high-frequency power applied to the top electrode 51 is 50 MHz or higher.

Example 2

As deposition gases, dimethylsilane gas ($SiH_2(CH_3)_2$) and $O_2$ gas were used, and their flow rates were set to be 50 sccm and 250 sccm, respectively. Other conditions were the same as those in the above described Example 1, and the frequency of the high-frequency power applied to the bottom electrode 2 was set to be the same eight frequencies as those in Example 1 to deposit thin films on wafers. The thin films thus obtained are SiCHO films wherein C and H are mixed in $SiO_2$ serving as a principal component. With respect to each of the thin films, the amount of degassed H and the etch rage due to hydrofluoric acid solution were examined similar to Example 1, so that the results shown by mark ○ in FIGS. 8 and 9.

Example 3

SiCHO films were deposited on wafers in the same manner as that in above described Example 2, except that alkoxysilane gas ($CH_3Si(OCH_3)_3$) was used in place of $SiH_2(CH_3)$ gas. With respect to each of the thin films, the amount of degassed H and the etch rate due to hydrofluoric acid solution were similarly examined, so that the results shown by mark △ in FIGS. 8 and 9.

Example 4

Figure 10:
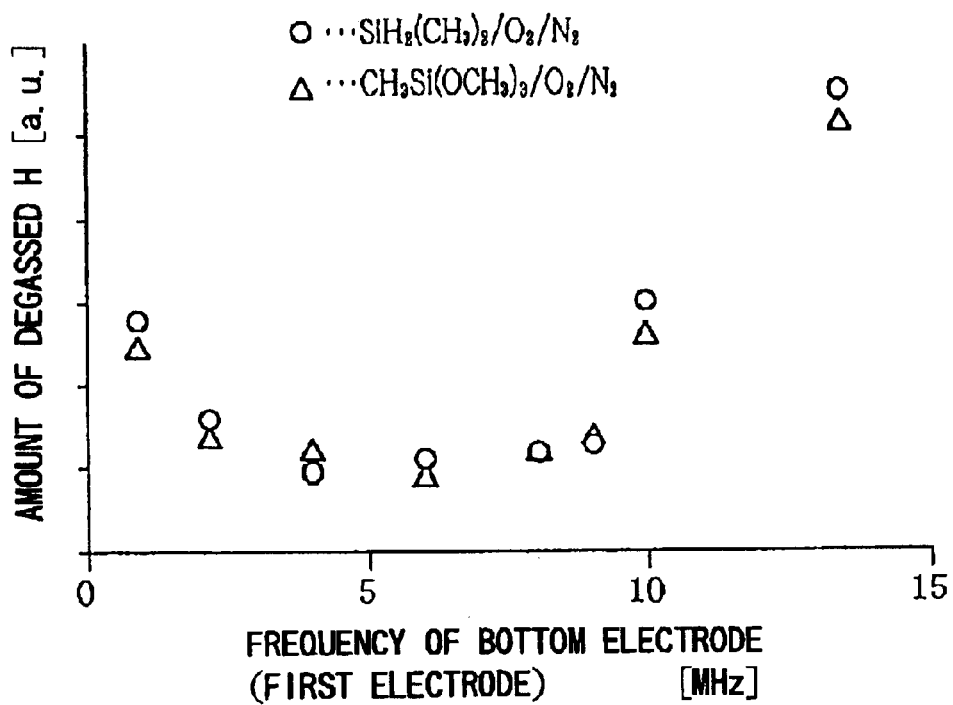
FIG. 10 is a characteristic diagram showing the relationship between the frequency of a high-frequency power applied to the bottom electrode and the amount of H eliminated from an SiCHNO film.
Figure 11:
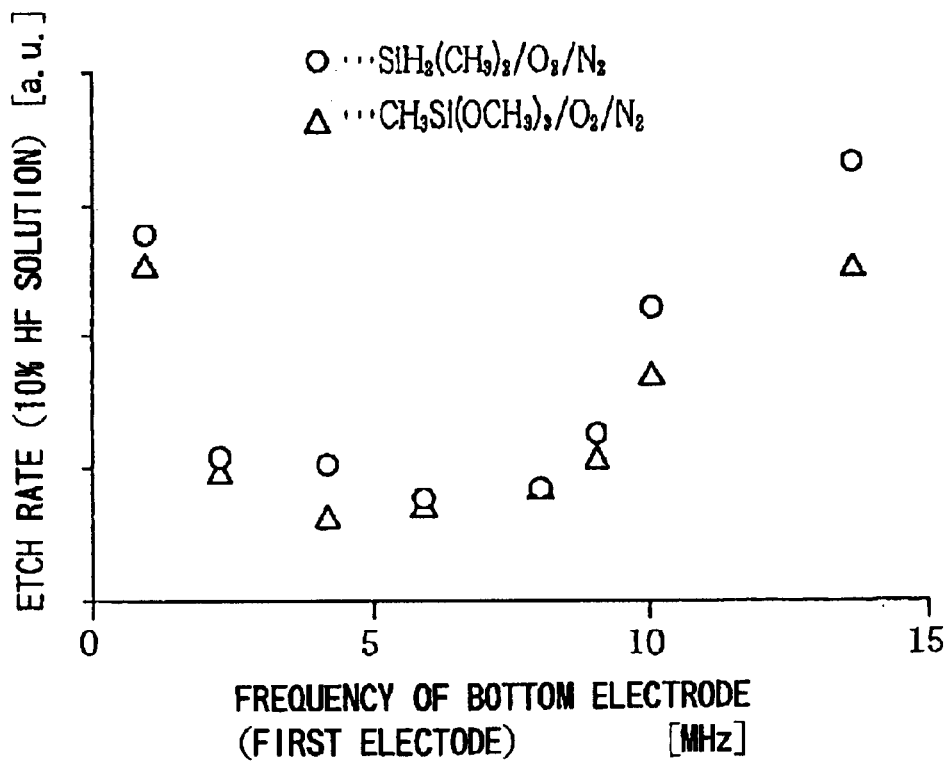
FIG. 11 is a characteristic diagram showing the relationship between the frequency of a high-frequency power applied to the bottom electrode and the etch rate of the SiCHNO film.

In addition to the gas used in the above described Example 2, $N_2$ gas was used as a deposition gas, and the flow rate of $N_2$ gas was set to be 50 sccm to deposit thin films on wafers in the same manner as that in Example 2. The thin films thus obtained are SiCHNO films wherein N is added to the SiCHO film obtained in Example 2. With respect to each of the thin films, the amount of degassed H and the etch rate due to hydrofluoric acid solution were similarly examined, so that the results shown by mark ○ in FIGS. 10 and 11.

Example 5

In addition to the gas used in the above described Example 3, $N_2$ gas was used as a deposition gas, and the flow rate of $N_2$ gas was set to be 50 sccm to deposit SiCHNO films on wafers in the same manner as that in Example 2. With respect to each of the thin films, the amount of degassed H and the etch rate due to hydrofluoric acid solution were similarly examined, so that the results shown by mark △ in FIGS. 10 and 11.

Example 6

Figure 12:
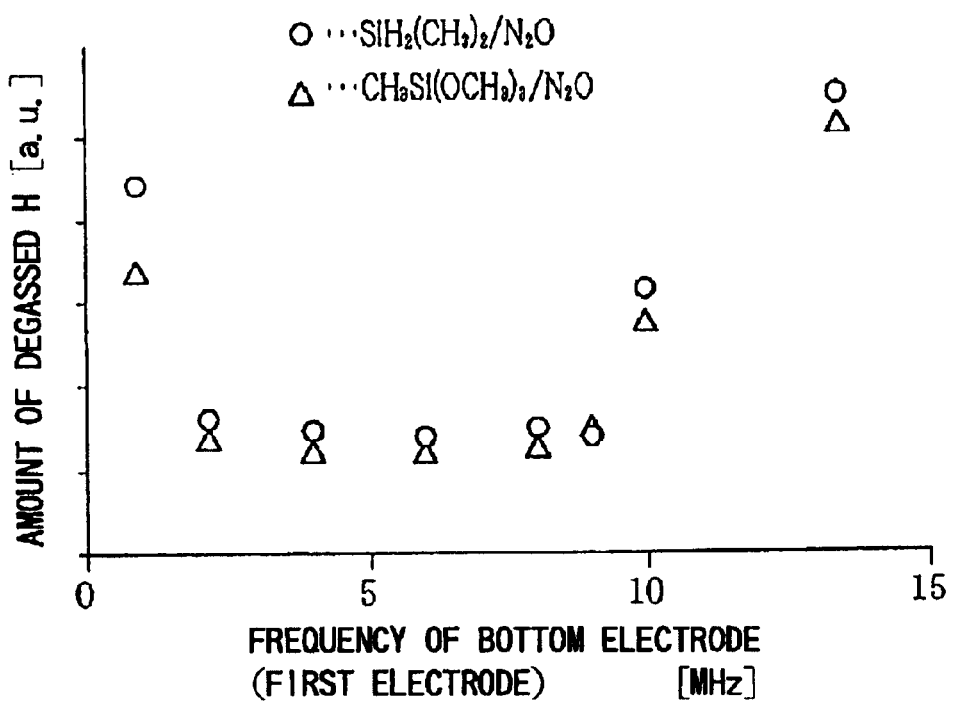
FIG. 12 is a characteristic diagram showing the relationship between the frequency of a high-frequency power applied to the bottom electrode and the amount of H eliminated from the SiCHNO film.
Figure 13:
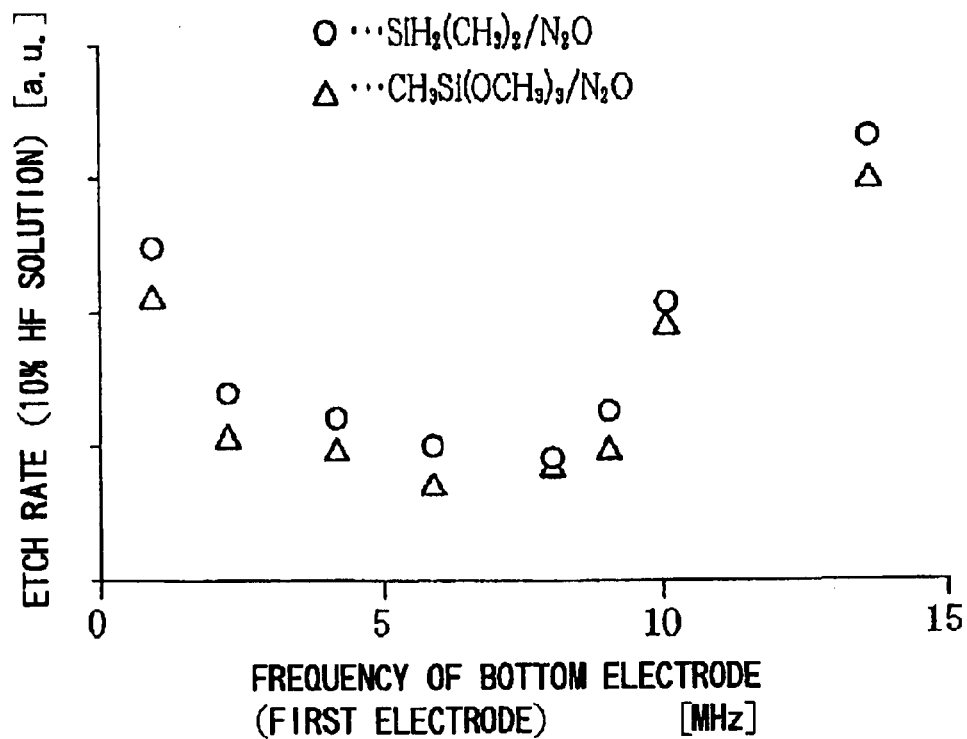
FIG. 13 is a characteristic diagram showing the relationship between the frequency of a high-frequency power applied to the bottom electrode and the etch rate of the SiCHNO film.

As deposition gases, $SiH_2(CH_3)_2$ gas and $N_2O$ gas were used, and their flow rates were set to be 50 sccm and 50 sccm, respectively, to deposit SiCHNO films on wafers in the same manner as that in Example 2. With respect to each of the thin films, the amount of degassed H and the etch rate due to hydrofluoric acid solution were similarly examined, so that the results shown by mark ○ in FIGS. 12 and 13.

Example 7

As deposition gases, $CH_3Si(OCH_3)_3$ gas and $N_2O$ gas were used, and their flow rates were set to be 50 sccm and 50 sccm, respectively, to deposit SiCHNO films on wafers in the same manner as that in Example 2. With respect to each of the thin films, the amount of degassed H and the etch rate due to hydrofluoric acid solution were similarly examined, so that the results shown by mark △ in FIGS. 12 and 13.

As can be seen from the results in Examples 2 through 7, when the frequency f1 is in the range of from 2 MHz to 9 MHz, the amount of eliminated H is small, and the etching rate is low, so that it is possible to obtain compact, high quality films having strong bonds. With respect to the influence of the frequency f2 of the high-frequency power applied to the top electrode 51, any experiments have not particularly been carried out. However, it is not feared there is no bad influence on the film if the frequency f2 is set to be 50 MHz similar to Example 1 since there is a problem in the sputtered substance of the top electrode is mixed in the film.

According to the present invention, by using a so-called parallel plate plasma processing system, it is possible to deposit a high quality insulating film having a low dielectric constant, so that it is possible to contribute to the improvement of, e.g., the operating speed of a device.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A plasma deposition method for carrying out a plasma deposition using a plasma processing system comprising:

a vacuum vessel, first and second electrodes which are provided in the vacuum vessel and which face each other in parallel, and first and second high-frequency power supplies capable of applying high-frequency powers having different frequencies to the respective electrodes, respectively, wherein a predetermined deposition gas is introduced into a space between said electrodes, and the first high-frequency power having a predetermined frequency selected from the range of from 2 MHz to 9 MHz and the second high-frequency power having a predetermined frequency selected from the range of 50 MHz or higher are applied to said first and second electrodes, respectively, to produce plasma to deposit a silicon oxide film, which contains a predetermined material having a lower dielectric constant than the dielectric constant of a silicon oxide film, on an object to be processed, which is mounted on said first electrode, and wherein said deposition gas contains at least one of an alkyl silane gas and alkoxy silane gas, and hydrogen gas.

2. A plasma deposition method for carrying out a plasma deposition using a plasma processing system comprising:

a vacuum vessel, first and second electrodes which are provided in the vacuum vessel and which face each other in parallel, and first and second high-frequency power supplies capable of applying high-frequency powers having different frequencies to the respective electrodes, respectively, said method comprising the steps of:

mounting an object to be processed, on said first electrode;

introducing a gas containing at least oxygen into said vacuum vessel;

applying a high-frequency power having a predetermined frequency selected from the range of 50 MHz or higher, to said second electrode;

thereafter, introducing a deposition gas containing at least silicon and a predetermined material to be added into said vacuum vessel, and applying a high-frequency power having a predetermined frequency selected from the range of from 2 MHz to 9 MHZ to said first electrode; and depositing a silicon oxide film, which contains a predetermined material having a lower dielectric constant than the dielectric constant of a silicon oxide film, on said object with the applied high-frequency powers, wherein said deposition gas contains at least one of an alkyl silane gas and alkoxy silane gas, and hydrogen gas.

3. A plasma deposition method as set forth in claim 1 or 2, wherein said predetermined material to be added contains fluorine.

4. A plasma deposition method as set forth in claim 1 or 2, wherein said predetermined material to be added contains carbon and hydrogen.

5. A plasma deposition method as set forth in claim 4, wherein said predetermined material to be added further contains nitrogen.

6. A plasma deposition method as set forth in claim 1 or 2, wherein said deposition gas further contains any one of nitrogen gas, nitrogen oxide gas, dinitrogen oxide gas, nitrogen tetra oxide gas and ammonia gas.

* * * * *